(12) United States Patent
Aviram

(10) Patent No.: US 8,058,644 B1
(45) Date of Patent: Nov. 15, 2011

(54) NANOSTRUCTURE FOR MOLECULAR ELECTRONICS COMPRISING COLLINEAR METAL LINES DEFINING PRECISE NANOSCALE GAP

(76) Inventor: Ari Aviram, Croton-on-Hudson, NY (US)

(*) Notice: Subject to any disclaimer, the term of this patent is extended or adjusted under 35 U.S.C. 154(b) by 1286 days.

(21) Appl. No.: 11/196,821

(22) Filed: Aug. 3, 2005

(51) Int. Cl.
*H01L 29/41* (2006.01)
*H01L 51/10* (2006.01)

(52) U.S. Cl. ............ 257/40; 257/773; 257/E29.12; 257/E51.002; 977/721; 977/932

(58) Field of Classification Search ............ 977/764, 977/780, 781, 832, 701, 720, 721, 789, 810, 977/932, 936, 937, 938; 257/9, 750, 758, 257/760, 773, E29.111, E29.112, E29.113, 257/E29.123, 40, E51.001, E51.002, E51.003, 257/E51.004, E51.005, E51.006, E51.007, 257/E51.008, E51.009, E51.01, E51.011
See application file for complete search history.

(56) References Cited

U.S. PATENT DOCUMENTS

| | | | | |
|---|---|---|---|---|
| 4,058,430 | A | 11/1977 | Suntola et al. | 156/611 |
| 6,699,779 | B2 * | 3/2004 | Chen et al. | 438/607 |
| 2003/0186167 | A1 * | 10/2003 | Johnson, Jr. et al. | 430/296 |
| 2005/0112860 | A1 * | 5/2005 | Park et al. | 438/597 |

OTHER PUBLICATIONS

Publication WO 2004/012234 A2 of International application PCT/US2003/023546. 36 double-sided pages.*

Qi; Li dong, Park; Sungho, Huang; Ling, Mirkin; Chad A., "On-Wire Lithography", Science, vol. 309, Jul. 1, 2005, pp. 113-115.
Guillorn et al., "Fabrication of dissimilar metal electrode with nanometer interelectrode distance for molecular electronic device characterization", 2000 American Vacuum Society, J. Vac. Sci. Technol. B 18(3) May/Jun. 2000, pp. 1177-1181.
Gusev et al., "High-resolution depth profiling in ultrathin $Al_2O_3$ films on Si", 2000 American Institute of Physics, vol. 76, No. 2, Jan. 10, 2000, pp. 176-178.
Kelly; Roberta, "Electron Beam Lithography", WATLabs Group Meetings, Univ. of Waterloo, Waterloo, Canada, 19 pages, and 4 pgs. Index, Jun. 27, 2003.
Saifullah et al., "A reliable scheme for fabricating sub-5 nm co-planar junctions for molecular electronics", Nanoscale Sci. Lab., Dept. of Engineer., Cambridge Univ., U.K. and CEMES-CNRS, France, 11 pages, including Refs. (Fischer et al., Appl. Phys. Lett. 62, 2989) (1993) and (Figs 1-4).
Wilk et al., "High-$k$ gate dielectrics: Current status and materials properties considerations", 2001 American Institue of Physics, vol. 89, No. 10, May 15, 2001, pp. 5243-5275.
ISA-The Instrumentation, Systems and Automation Society, *OWL Etches Out Nano Wires*, Jul. 6, 2005 ISA Network, Your Online Connection.

* cited by examiner

*Primary Examiner* — Samuel Gebremariam
*Assistant Examiner* — Andrew O. Arena
(74) *Attorney, Agent, or Firm* — Arendt & Associates IP Group; Jacqueline Arendt

(57) ABSTRACT

A nanostructure pattern which includes pairs of metal lines separated by identical gaps whose dimensions are in the nanometer range, can be prepared by providing a separating sacrificial layer, whose dimensions can be controlled precisely, in the separation gap between the first metal line and the second metal line. The sacrificial layer is removed at the end of the fabrication, leaving a precisely dimensioned gap between the lines.

28 Claims, 3 Drawing Sheets

NANOSTRUCTURE FOR MOLECULAR ELECTRONICS COMPRISING COLLINEAR METAL LINES DEFINING PRECISE NANOSCALE GAP

TECHNICAL FIELD

The present invention is concerned with materials and methods for producing patterns of conductive wires, semiconducting and insulating structures with nanometer-size gaps. The patterns are needed in various areas of technology, but most importantly in the area of nanotechnology for preparing quantum dots and other quantum devices, and for wiring molecular devices for molecular electronics, including carbon nanotubes or other nanotubes. It is very important to be able to prepare such structures efficiently and reliably with consistent results. The present invention makes it possible to fabricate precise nanometer-size structures.

BACKGROUND ART

The fabrication of patterned devices often requires high-precision lithography. As the dimensions of the features decrease, so do the number of techniques available for fabricating them. The problem is particularly acute when the necessary patterns are of nanometer size. In this case, the only lithography available is electron-beam (e-beam) lithography. However, according to Kelly; Roberta, in "Electron Beam Lithography" the results can be imprecise because of uneven distribution of the resist on the wafer surface, which results in improper focusing of the electron beam and imprecise deviations of line thickness' from what is desired. The nanostructure wires thus formed can vary from the desired thickness'.

Since current methods for preparing nanometer-size structures are not precise, the structures are created by a hit-or-miss type of technique. For example, the lithographic preparation of a metal-gap-metal structure with a 4-nm gap is accomplished by e-beam lithography (1). According to the prevailing method, a series of metal lines is prepared first and these lines are paired with a commensurate series of lines across gaps. To ensure the formation of the metal-gap-metal structure with the desired gap size, the gaps formed when the pairing series is deposited are varied in the form of a wedge, from larger to smaller than the required gaps, in an attempt to hit the right gap size by chance. This imprecise technique is wasteful and time-consuming, and it is not suited for manufacturing processes. In addition, it is necessary to select the correct pair by closely examining the entire series with electron microscopy or atomic force microscopy (with nanotube tips) and ultimately by tunneling measurements. Usually the pairs which do not fit the desired gap dimensions are ignored.

While structures containing 4-nm size gaps have been obtained using the above described technique (such as in FIG. 1b herein), the process for fabricating them is complicated.

The fabrication of metal-gap-metal patterns with gaps below 4 nm is rarely attempted by lithographic techniques. Such small gaps are fulfilled by break-junction techniques, and not by any lithographic method.

The prior art reference of U.S. Pat. No. 4,058,430 of Suntola et al, (6) describes a very accurate method for growing thin films of great accuracy in the nanometer range using layer by layer deposition.

REFERENCES CITED 1a. a. M. A. Guillorn, D. W. Carr, R. C. Tiberio, E. Greenbaum and M. I. Simpson, Journal of Vacuum Science and Technology, 2000, B 18(3), 1177,
1b. M. S. Safulah, T. Oudarcuhu, D. K. Kostov, C. Joachim and M. E. Welland, Nanotechnology, 2000, 13, 659.
2. G. D. Wilk, R. M. Wallace and J. M. Anthony, Journal of Applied Physics, 2001, 89, 5243.
3. E. P. Gusev, M. Copel, E. Cartier, I. J. R. Baumvol, C. King, and M. A. Gribelyuk, Applied Physics Letters, 2000, 76, 176.
4. K. Forsgren, CVD and ALD of Group IV- and V-Oxides for Dielectric Applications, Acta Universitatis Upsaliensis, Uppsala, 2001.
5. Mikko Ritala and Merkku Leskela, Atomic Layer Deposition, Handbook of Thin Film Materials, H. S. Nalwa, Ed. Academic Press, San Diego, Calif. 2001, Vol. 1 Chapter 2.
6. T. Suntola and J. Anstom, U.S. Pat. No. 4,058,430 (1977).

OBJECTS OF THE INVENTION

It is an object of the present invention to describe materials for fabricating lithographic nanostructures of precise dimensions in the range of 1 to 100 nm.

In addition, it is an object of the present invention to describe a method for improving the performance of current lithographic technologies to produce nanometer-size structures with precise separations (or gaps).

Furthermore, it is an object of the present invention that the materials and methods described enhance conventional lithographic technology, with no requirement for new lithographic resists.

SUMMARY OF THE INVENTION

In keeping with these objects and others which may become apparent, according to the present invention, a pattern of lines including pairs of metal lines separated by identical gaps whose dimensions are in the nanometer range, can be prepared by providing a separating sacrificial layer, whose dimensions can be controlled precisely, in the gap between the first metal line and the second metal line. The sacrificial layer is removed at the end of the fabrication, leaving a precisely dimensioned gap between the lines.

According to this invention the pattern is fabricated in four major steps:

1. Half of the pattern lines are placed on the surface first.
2. Each line is enveloped with a sacrificial layer whose thickness corresponds to the planned size of the gap.
3. The second set of lines is fabricated on the surface, in such a way that the edge of each second line overlaps with the corresponding sacrificial layer.
4. The sacrificial layer is removed, leaving a pattern of pairs of lines separated by gaps of predetermined dimensions.

Then the pattern is fabricated.

Following is a more detailed description of the pattern fabrication:

A planar substrate with an insulating surface is provided.
The entire surface is coated with a material which will repel the formation of a sacrificial layer. Such a material is 1,1,1,3,3,3-hexamethyldisilazane (HMDA) or other materials which will form a hydrophobic (water repelling) surface.

Examples of such materials are organic siloxanes, organic trichlorosilanes, hydrocarbons, and teflons.

The first set of lines, which constitutes half the pattern, is fabricated on the thus formed hydrophobic surface by means of a conventional lithographic technique combined with a film deposition technique. The lines can be fabricated from a metal, a semiconductor, or an insulator.

The pattern is fabricated from materials that are hydrophilic (water loving), or which can be made hydrophilic without altering the hydrophobic nature of the rest of the surface, by treatment with a suitable material.

Examples of materials which can enhance hydrophilicity and attach themselves exclusively to gold, platinum, palladium and copper are dithioerythritol, cysteine, mercaptopyruvic acid sodium salt, mercaptoacetic acid and many others. These materials share in common a group that attaches specifically to the metal pattern, and a residual portion that is hydrophilic.

Next, the entire surface, including the pattern, is exposed to a material that can form the sacrificial layer whose thickness can be precisely controlled. The properties of the sacrificial layer are as follows:

The sacrificial layer has to be made of a material that is different form the material that embodies the pattern or the surface.

The layer will not grow on hydrophobic surfaces.

The sacrificial layer can be grown by known techniques, which are known to produce layers of precise thickness in the nanometer range. Using these methods, the film grows equally on horizontal or vertical surfaces.

The composition of the sacrificial layer is chosen so that it can be easily removed without causing any damage to the surface or to the pattern.

For clarification, it is noted that up to this point the surface contains part of the lines pattern, which are covered by a layer of the sacrificial material, whose dimensions are those of the planned gap.

The sacrificial films can be used to advantage to maintain a separation gap having a precise distance, located between the original structure and another structure, that is deposited in a subsequent operation. For this purpose, a second set of lines is deposited to complete the pattern. The resulting pattern is a set of line-pairs. This set is also deposited by a conventional lithographic technique, followed by film deposition. This set of lines should reach the first pattern and overlap with the edges of the sacrificial layer in the region of the planned gaps.

The next step completes the fabrication of the pattern. The sacrificial layer is removed by an etching technique that is specific for the removal of the sacrificial layer, but is incapable of harming the surface and the rest of the pattern. During the removal of the sacrificial layer, the overlapping segment of the second pattern, which is in contact with it, falls off in a manner that is known to occur during "liftoff" processes.

For further clarification, in the "liftoff" technique a residual-resist layer is removed with a solvent. When the resist is removed it carries with it everything that is on the resist surface, leaving behind all the structures that were not on the surface of the resist.

What is left on the surface is the pattern shown in FIG. 2e, which contains gaps whose dimensions are of the required thickness, matching the thickness of the sacrificial layer. In this way the sacrificial film controls the distance between the structure pairs.

It is possible to control the thickness of deposited films with great precision. When the atomic layer deposition (ADL) technique (2, 3, 4, 5) is used to deposit the sacrificial layer, it is possible to control the deposited film thickness in increments of 0.3 nm per deposition cycle. Three cycles can provide continuous films about 1 nm thick. Such films are particularly suitable for use as sacrificial layers for the purpose of this invention. Films provided by other techniques such as chemical vapor deposition (CVD) are also suitable for this purpose. Other possible methods for preparing sacrificial layers with great precision are sputtering, evaporation and molecular beam epitaxy (MBE).

This invention is not restricted to e-beam lithography. In fact, any lithography can benefit from this invention, whether it is a currently practiced lithography such as ultraviolet (UV) lithography or a lithography that is still in development, such as X-ray lithography or extreme UV lithography (EUVL). The current invention is suited for the formation of nm-size structures or separations between structures, regardless of the method by which the structures are fabricated.

DESCRIPTION OF DRAWINGS

The present invention can best be understood in conjunction with the accompanying drawings, in which:

FIG. 1b shows subsequently the hit-or-miss technique wherein the corresponding group of lines is deposited, with decreasing gap sizes, in the hope that one of the gaps in the series will have the desired gap dimensions.

FIG. 2e is a top plan view of the resultant metal lines produced with a desired separation gap therebetween; wherein:

FIG. 2a shows that a nm-size metal line is placed on a substrate surface;

FIG. 2b shows that the surface of the line is coated with a layer of a sacrificial layer material with known thickness;

FIG. 2c shows that to the substrate line structure of FIG. 2b is added another nm-size substrate line structure which overlaps with an edge over the sacrificial layer;

FIG. 2d shows that the sacrificial layer is removed by selective etching, leaving a well-defined structure on the surface, as also shown in FIG. 2e.

The present invention can also be applied to lithographic or other types of nanometer features of insulating or semiconductor material; however, the drawings depict the most prevalent application involving metal lines with gaps on an electrically insulating substrate to support an electric circuit which is basically a maze of transistors and metallic interconnects.

Figure 1A:
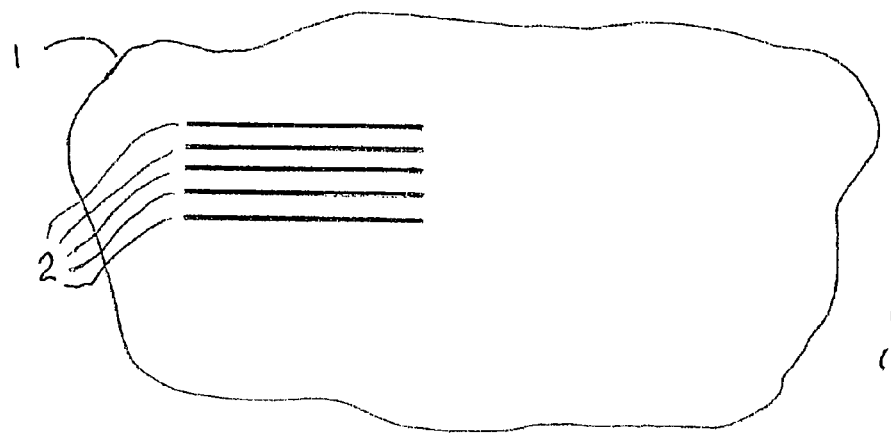
FIGS. 1a and 1b are top plans views which show a primitive prior art method for producing nanometer (nm)-size metal-gap-metal structures, where in FIG. 1a shows a series of nm-size lines being provided
Figure 1B:
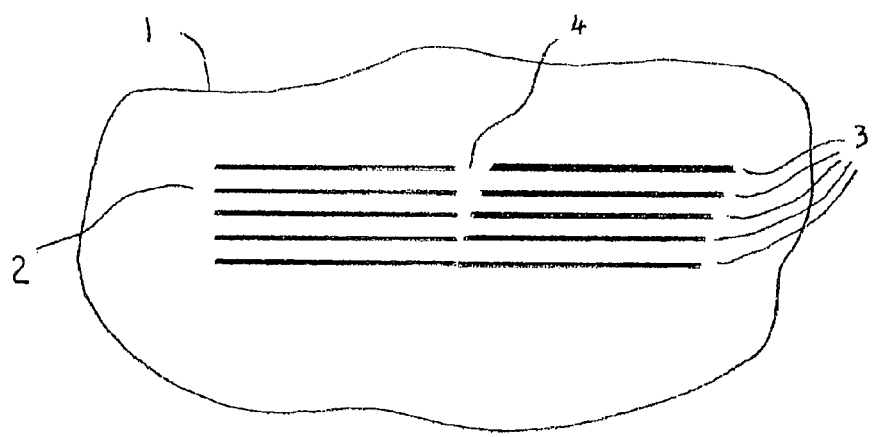

FIGS. 1a and 1b illustrate some prior art details of obtaining a desired gap through a trial and error scheme. The first phase is shown in FIG. 1a. This involves laying down a pattern of metallization 2 on insulating substrate 1; five such lines are shown. Then, as shown in FIG. 1b, the second phase involves laying down a pattern of lines 3 in registration with lines 2 but with a decreasing gap size 4 so that one of the left 2 and right 3 line pairs might meet the desired gap criteria since fabrication of nanometer sized gaps cannot be controlled with precision.

Figure 2A:
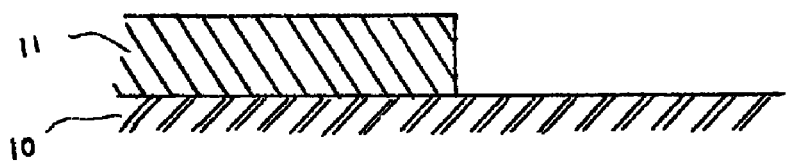
FIGS. 2a, 2b, 2c and 2d are side elevational views in cross section showing a single vertically-extending metal line produced by the present invention for producing nm-size gaps according to this invention
Figure 2B:
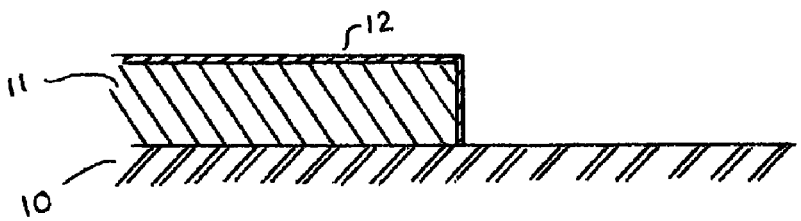
Figure 2C:
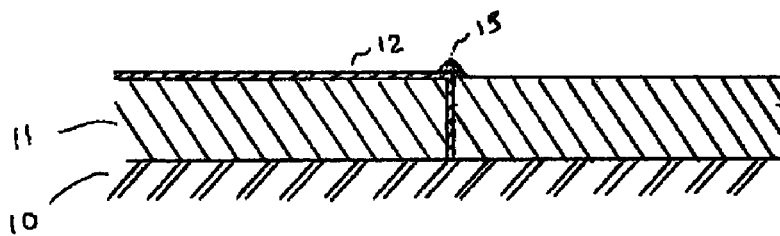
Figure 2D:
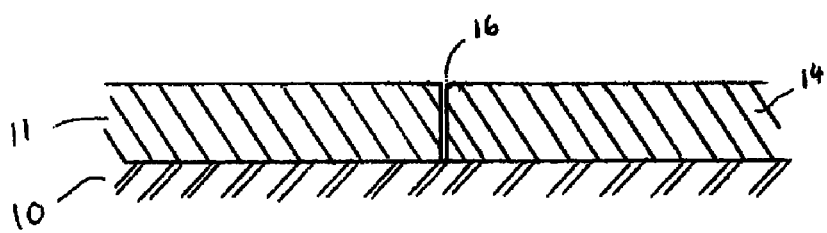

FIGS. 2a-2d is a series of side crossectional views, greatly enlarged, which describe the process of the present invention. Substrate 10 is hydrophobic to prevent the growth of sacrificial material on its top surface. In FIG. 2a, the end of a metal line 11 is shown. The next step, shown in FIG. 2b is the addition of sacrificial layer 12 over line 11 to a carefully controlled thickness identical to the desired gap size. Note that horizontal and vertical thickness of layer 12 are identical. The surface of first metallization 11 should be hydrophilic to encourage the growth of the sacrificial pattern if the layer by layer technique is used. In step 2c, a second metallization line 14 is put down so that it overlaps slightly line 11 to insure its butting against the vertical portion of layer 12. Note that a small amount of metallization 15 may be deposited on the top surface of layer 12 at the junction. The next step is an etching process which removes sacrificial layer 12 resulting in the desired outcome of FIG. 2d, namely a line of metallization, 11 and 14, with gap 16 between of the desired size equal to the thickness of removed layer 12. Note that if substrate 10 top surface were not hydrophobic, all or part of metallization 14 would have been put down on a surface of sacrificial layer 12. In that case, the etching process would have removed all or part of line 14 in the etching process as part of the "lift-off" which desirably removed small metallization bump 15.

Figure 2E:
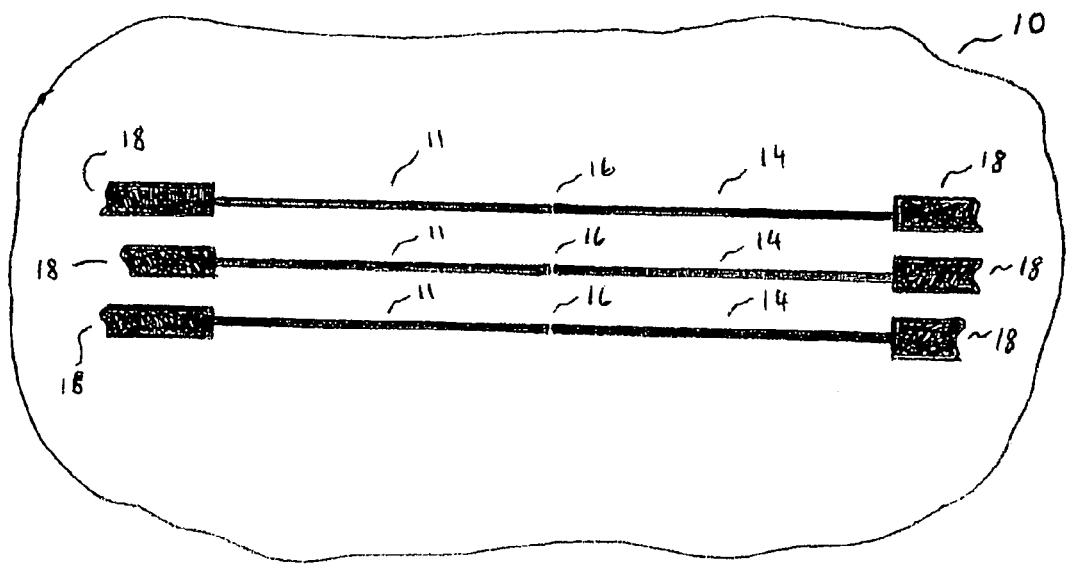

FIG. 2e shows a top view of a pattern of three lines, pairs 11 and 14, with gaps 16 between. Truncated sections of metallization 18 at each end depict the normal width of the signal transport lines.

DETAILED DESCRIPTION OF VARIOUS MODES FOR CARRYING OUT THE INVENTION

According to this invention, nm-size lithographic structures can be separated by unprecedented small dimensions and with a precision that is very hard to obtain by other means. It was found that the use of sacrificial films deposited by ALD, provides the means for fabrication of precise nanostructures. ALD is known to produce films of controlled thickness, in which each deposited layer represents a single atomic layer. For example, the layer-by-layer deposition of aluminum-oxide proceeds in increments of 0.3 nm at a time. The total film thickness is determined by the number of deposition cycles. For aluminum oxide, the thickness of 0.3 nm represents an atomic layer.

According to this invention, the sacrificial films can be made by one or more of the following methods:

The films can be deposited by the ALD technique.
The films can be deposited by self-assembly techniques.
The films can be grown by MBE.
The films can be grown by CVD.
The films can be grown by sputtering.
The films can be grown by evaporation.

Other desirable properties of the sacrificial films are the following:

1. The thickness of the films should be precisely controllable.
2. The films should be selectively etchable.
3. The films should adhere to the deposited pattern.
4. The film should not grow on hydrophobic surfaces.
5. Removal of the sacrificial films by etching should produce liftoff.

Examples of the preferred composition of matter employed as sentinel films or sacrificial layers pursuant to this invention are the following: aluminum oxide, silicon dioxide, silicon nitride, silicon oxynitride, hafnium oxide, zirconium oxide, and magnesium oxide, self-assembled organic monolayers, self-assembled organometallic monolayers.

The most preferred compound of the present invention is aluminum oxide. The reason for this preference is the relative ease of preparation of the film, which is due to the high volatility of the material source and the high reactivity of the source (starting material). In a typical preparation of the sentinel film, the source of the aluminum oxide is trimethyl aluminum or triethyl aluminum. The source material is introduced into a chamber containing the substrate to be coated with a stream of dry nitrogen. The gas is brought into contact with the substrate and forms a single and continuous molecular layer over the entire surface. This step is followed by passing a stream of wet nitrogen over the substrate, which decomposes the surface-bound diethyl aluminum to aluminum oxide (3). The cycle is repeated as many times as needed, based on the thickness of the needed oxide film.

EXAMPLES

Example 1

The following nonlimiting examples are presented to illustrate the present invention.

A silicon wafer is provided and uniformly coated with a silicon dioxide layer, 1000-angstroms thick.

The wafer is coated with a layer of HMDS.

The wafer is coated with a layer of e-beam resist composed of PMMA 8.5% MMA copolymer, followed by a layer of PMMA e-beam resist. The bilayer structure permits liftoff metal deposition in a later step. The resist is exposed by e-beam lithography as is known in the art and developed with a methylisobutyl ketone/isopropanol 1:1 mixture. A pattern is produced in the resist film. A short step of reactive ion etching is used to remove any scum left over in the developed areas, and the exposed HMDS film.

The surface containing the developed film pattern is coated with a film of gold, which is half as thick as the resist film, and the excess metal film is removed by liftoff together with the residual resist. A gold pattern remains on the surface in the areas where the resist was removed by lithography.

The wafer is immersed in an aqueous solution containing mercaptoaceric acid.

The wafer is rinsed thoroughly to remove all excess acid.

The substrate is placed in an ALD reactor and coated with aluminum oxide. Ten deposition cycles produces a 30-angstrom-thick sacrificial film.

The second part of the lithography, for the formation of the complementary metal lines, follows. In this step the surface is again coated with resist and exposed by e-beam with the complementary pattern. This is followed by development, scum and HMDS removal, and deposition of the second gold layer, just as the first set of lines was deposited.

The final structure is obtained by placing the pattern in a selective aluminum oxide etching solution. The sacrificial aluminum oxide is removed leaving the gold-gap-gold pattern on the surface. The gap measures 30 angstroms.

Example 2

The procedure of Example 1 is used to produce a platinum-gap-platinum pattern.

Example 3

The process of Example 1 is used with a sacrificial layer made of zirconium oxide.

Example 4

The procedure of Example 1 is used to produce a platinum-gap-titanium pattern.

In the foregoing description, certain terms and visual depictions are used to illustrate the preferred embodiment. However, no unnecessary limitations are to be construed by the terms used or illustrations depicted, beyond what is shown in the prior art, since the terms and illustrations are exemplary only, and are not meant to limit the scope of the present invention.

It is further known that other modifications may be made to the present invention, without departing the scope of the invention, as noted in the appended Claims.

What is claimed is:

1. A nanostructure suitable for use in nano-technological circuits and in molecular electronics circuits, the nanostructure comprising:
   a planar, insulating substrate surface;
   a first thin-film, metal line structure comprising a precious metal and having a first top surface and a first bottom surface and a first metal line structure vertical end surface, the first bottom surface adhering to the planar, insulating substrate surface;
   a second thin-film, metal line structure comprising the same or a different precious metal and having substantially the same thickness and height as the first thin-film, metal line structure, and having a second top surface, a second bottom surface, and a second metal line structure vertical end surface, the second bottom surface adhering to the planar, insulating substrate surface, with the proviso that the first thin-film metal line structure and the second thin-film metal line structure lie on the same line adjacent to one another such that the first metal line structure vertical end surface and the second metal line structure vertical end surface are opposite one another and facing one another and separated by a gap having a pre-determined precise gap width of from about 0.3 nanometer to about 10 nanometers, and a gap length equal to a width of the first thin-film line structure or the second thin-film line structure.

2. The nanostructure of claim 1 wherein the planar, insulating substrate surface comprises silicon.

3. The nanostructure of claim 1 wherein at least one of the first and the second thin-film, metal line structures comprises the precious metal gold.

4. The nanostructure of claim 3 wherein both the first and the second, thin-film metal line structures comprise the precious metal gold.

5. The nanostructure of claim 1 wherein at least one of the first and the second thin-film, metal line structures comprises the precious metal that is selected from the group consisting of platinum, titanium, rhodium, iridium, nickel, chrome and copper, and combinations thereof.

6. The nanostructure of claim 5 wherein both the first and the second, thin-film metal line structures comprise the same precious metal, wherein the precious metal is selected from the group consisting of platinum, titanium, rhodium, iridium, nickel, chrome and copper.

7. The nanostructure of claim 1, wherein the gap width is from about 0.3 nanometer to about 5 nanometers.

8. The nanostructure of claim 1, comprising a plurality of pairs of first and second thin-film metal line structures wherein all of the gaps are of a precisely identical gap width.

9. A method of producing the nanostructure of claim 1, the method comprising:
   fabricating on the planar, insulating substrate surface the first thin-film, metal line structure comprising a first precious metal and having a first top surface and a first bottom surface and a first metal line structure vertical end surface, the first bottom surface adhering to the planar, insulating substrate surface;
   depositing on said first thin-film, metal line structure a coating of sacrificial material having a thickness corresponding precisely to the predetermined precise gap width of from about 0.3 nanometer to about 10 nanometers;
   fabricating a second thin-film, metal line structure on the planar, insulating substrate surface, the second thin-film line structure comprising a second precious metal that is the same or different from the first precious metal, and having substantially the same thickness and height as the first thin-film, metal line structure, and having a second top surface, a second bottom surface, and a second metal line structure vertical end surface, the second bottom surface adhering to the planar, insulating substrate surface, with the proviso that the first thin-film metal line structure and the second thin-film metal line structure lie on the same line adjacent to one another such that the first metal line structure vertical end surface and the second metal line structure vertical end surface are opposite one another and facing one another and wherein the vertical end surface of said second thin-film line structure is in contact with the coating of sacrificial material on the vertical end surface of said first line structure; and
   removing substantially all of the sacrificial material thereby producing the nano structure of claim 1 wherein the first metal line structure vertical end surface and the second metal line structure vertical end surface are opposite one another and facing one another and separated by a gap having a pre-determined precise gap width of from about 0.3 nanometer to about 10 nanometers, and a gap length equal to a width of the first thin-film line structure or the second thin-film line structure.

10. The method of claim 1 wherein said depositing of said sacrificial material is by atomic layer deposition, and is repeated one atomic layer at a time, building up layers of said sacrificial material until a predetermined thickness is reached.

11. The method of claim 1 further including producing a plurality of nanometer size gaps by placing patterns of said thin-film lines on said surface.

12. The method of claim 1 wherein the planar, insulating substrate surface comprises silicon.

13. The method of claim 1 further including coating said surface with a repellant material that repels the material of the sacrificial layer; and allowing the repellant material to repel the material of the sacrificial layer.

14. The method of claim 1, wherein the fabricating of at least one of the first thin-film line structure and the second thin-film line structure is accomplished by a lithographic technique, followed by film deposition.

15. The method of claim 14, wherein the fabricating of the first thin-film line structure or the second thin-film line structure is accomplished by ultraviolet lithography.

16. The method of claim 1, wherein the fabricating of at least one of the first thin-film line structure and the second thin-film line structure is accomplished by e-beam lithography.

17. The method of claim 1, wherein the fabricating of at least one of the first thin-film line structure and the second thin-film line structure is accomplished by ultraviolet lithography.

18. The method of claim 1, wherein the fabricating of at least one of the first thin-film line structure and the second thin-film line structure is accomplished by x-ray lithography.

19. The method of claim 1 wherein the fabricating of at least one of the first thin-film line structure and the second thin-film line structure accomplished by extreme UV lithography.

20. The method of claim 1A method as in claim 1, wherein the removing the sacrificial layer employs an etching technique.

21. The method of claim 1, wherein the removing the sacrificial layer utilises a solvent.

22. The method of claim 1, wherein the first and the second thin-film line structures are positioned such that an end of the first thin-film line structure is in line with an end of the second thin-film line structure.

23. The method of claim 1, wherein the first and the second precious metals are gold.

24. The method of claim 1, wherein the depositing the comprises evaporation.

25. The method of claim 1, wherein depositing the comprises molecular beam epitaxy.

26. The method of claim 1, wherein depositing the selectively etchable sacrificial layer comprises self-assembly techniques.

27. The method of claim 1 in which said second thin-film line structure when put in place has a portion which overlaps the selectively etchable sacrificial layer that envelops said first thin-film line structure.

28. The method of claim 1 in which the said overlapping portion is removed when said selectively etchable sacrificial layer is removed.

* * * * *